United States Patent [19]

Scott et al.

[11] Patent Number: 5,424,660
[45] Date of Patent: Jun. 13, 1995

[54] DECL LOGIC GATES WHICH OPERATE WITH A 3.3 VOLT SUPPLY OR LESS

[75] Inventors: David B. Scott, Plano; Harold D. Goodpaster, Sherman, both of Tex.

[73] Assignee: Texas Instruments Incorporated, Dallas, Tex.

[21] Appl. No.: 76,040

[22] Filed: Jun. 15, 1993

[51] Int. Cl.$^6$ .................... H03K 19/086; H03K 19/20
[52] U.S. Cl. ........................... 326/126; 326/80; 327/202
[58] Field of Search ............... 307/455, 475, 471, 289, 307/272.2

[56] References Cited

U.S. PATENT DOCUMENTS

| | | | |
|---|---|---|---|
| 4,680,486 | 7/1987 | Price et al. | 307/455 |
| 4,743,781 | 5/1988 | Bhatia et al. | 307/455 |
| 4,771,190 | 9/1988 | Umeki | 307/455 |
| 4,806,800 | 2/1989 | Khan | 307/475 |
| 4,866,306 | 9/1989 | Hopta | 307/455 |
| 4,954,738 | 9/1990 | Gaudenzi | 307/455 |
| 4,962,341 | 10/1990 | Schoeff | 307/455 |
| 4,996,445 | 2/1991 | Lin | 307/455 |
| 5,045,807 | 9/1991 | Ishihara et al. | 307/455 |
| 5,089,789 | 2/1992 | VanTran | 307/475 |
| 5,105,106 | 4/1992 | Barre | 307/475 |

*Primary Examiner*—Edward P. Westin
*Assistant Examiner*—Richard Roseen
*Attorney, Agent, or Firm*—Mark A. Valetti; Douglas A. Sorensen; Richard L. Donaldson

[57] ABSTRACT

A differential emitter coupled logic circuit having an output and a compliment of the output, the circuit comprising: a first emitter coupled transistor pair (Q17 and Q18); a second emitter coupled transistor pair (Q19 and Q20); a third emitter coupled transistor pair (Q25 and Q26); a fourth emitter coupled transistor pair (Q33 and Q34); a filch emitter coupled transistor pair (Q37 and Q38); and a sixth emitter coupled transistor pair (Q35 and Q36).

3 Claims, 6 Drawing Sheets

DECL LOGIC GATES WHICH OPERATE WITH A 3.3 VOLT SUPPLY OR LESS

Emitter coupled logic (ECL) circuits currently operate best at 3.5 volts or above. This is particularly true of differential ECL (DECL). As a general rule, 3.5 volts minimally satisfies the voltage required to maintain the needed base-emitter voltages for proper operation of bipolar transistors in an ECL circuit. The use of differential logic allows for higher speed over single ended ECL due to the lower voltage swing of DECL as compared with single ended ECL. The conventional way of providing differential ECL involves stacking the transistors, i.e. coupling a series of transistors together.

Figure 1A:
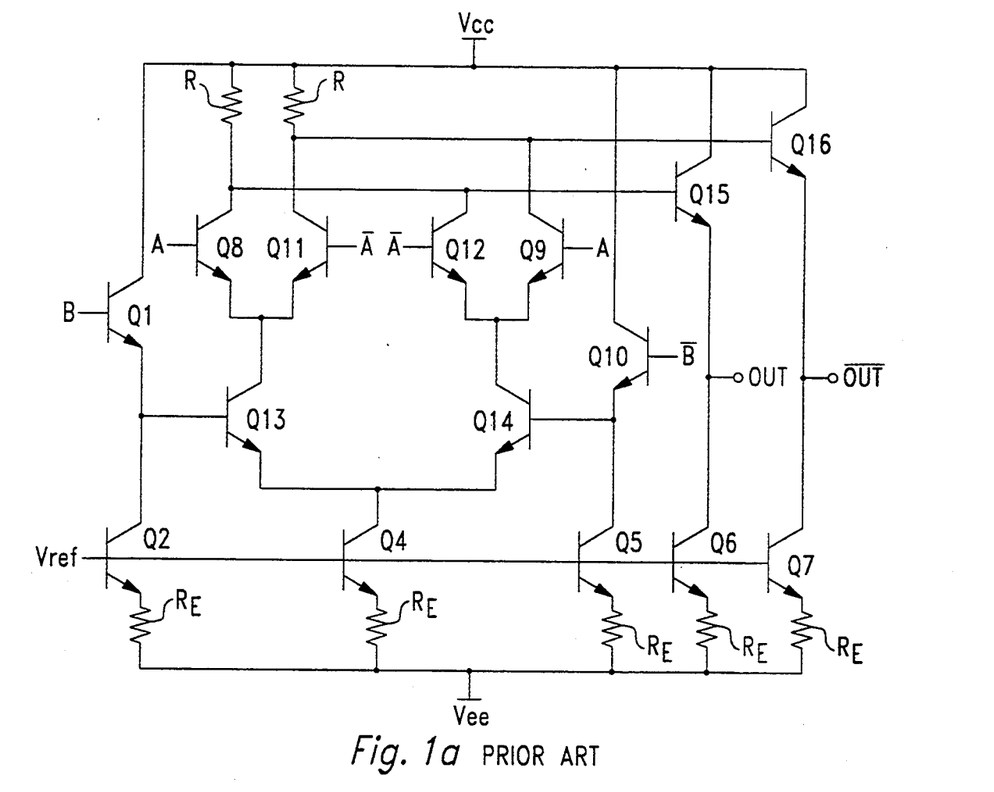
FIG. 1a is a schematic drawing which illustrates a conventional circuit for providing differential ECL.
Figure 1B:
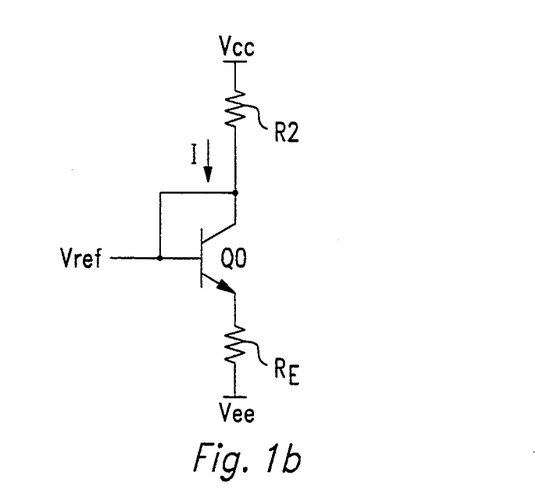
FIG. 1b is a schematic drawing of a circuit which generates a reference voltage, Vref.

FIG. 1a is a schematic drawing which illustrates a conventional circuit for providing differential ECL. The circuit in FIG. 1a implements an exclusive OR (XOR) gate. During operation, a reference voltage, Vref is placed at the base of bipolar transistor Q2. Vref can be generated according to a number of well known ways. For instance, a simple way to generate Vref is shown in the schematic drawing of FIG. 1b. Diode connected npn transistor Q0 is connected to resistor R2 and emitter resistor $R_E$. Current I flows into the base and collector of transistor Q0. The power rails of the circuit of FIG. 1b, like that of FIG. 1a are at voltage Vcc and circuit ground. Current I can be approximated by the emitter current of transistor Q2. Thus, Vref$=IR_E+V_{be}$, where $V_{be}$ is the base-emitter voltage of an associated activated transistor, e.g. transistor Q2 in this case. With reference back to FIG. 1a, approximating the collector current of transistor Q2 by its emitter current, the collector current of transistor Q2 is approximated by $(Vref-V_{be})/R_E$. This current is substantially mirrored through the emitter resistors $R_E$ and emitters and collectors of npn bipolar transistors Q4, Q5, Q6, and Q7, each of which pull current through a separate leg of the circuit and receive the common reference voltage, Vref, at their bases. These transistors are generally termed non-logic switching transistors and can therefore operate in their saturated states. Logic input signals A and B as well as their complements $\overline{A}$ and $\overline{B}$ are input to the bases of selected npn bipolar transistors. More specifically, input B is input to the base of transistor Q1 whose emitter is connected to the collector of transistor Q2 and input A is input to the bases of transistors Q8 and Q9. Input $\overline{B}$ is input to the base of transistor Q10 while input $\overline{A}$ is input to the base of transistors Q11 and Q12. Transistors Q8 and Q11 form a first pair of emitter-coupled transistors, each transistor having a collector biasing resistor, R. Transistors Q 12 and Q9 form a second pair of emitter-coupled transistors. Note that selected collectors of the first and second pair of emitter-coupled transistors are connected together (i.e the collectors of Q8 and Q12 are connected together and the collectors of Q11 and Q9 are connected together). Transistors Q13 and Q14 form a third pair of emitter-coupled transistors wherein the collector of transistor Q13 is connected to the emitters of the first pair of emitter-coupled pairs and the collector of transistor Q14 is connected to the emitters of the second pair of emitter coupled pairs. An output OUT is taken from the emitter of npn bipolar transistor Q15 which has its base connected to the collectors of transistors Q8 and Q12. Transistor Q15 serves to amplify output OUT and is connected to the collector of transistor Q6. An inverted output $\overline{OUT}$ is taken from the emitter of npn bipolar transistor Q16 which has its base connected to the collectors of transistors Q11 and Q9.

The operation of the circuit illustrated in FIG. 1a follows that of an exclusive OR operation. Consequently outputs OUT and $\overline{OUT}$ achieve the following logic states (logic 0 and logic 1) in response to the inputs listed as shown in table 1 below:

TABLE 1

| INPUT A | INPUT B | INPUT $\overline{A}$ | INPUT $\overline{B}$ | $\overline{OUT}$ | OUT |
|---|---|---|---|---|---|
| 0 | 0 | 1 | 1 | 0 | 1 |
| 0 | 1 | 1 | 0 | 1 | 0 |
| 1 | 0 | 0 | 1 | 1 | 0 |
| 1 | 1 | 0 | 0 | 0 | 1 |

Emitter coupled logic circuits avoid the use of a large input-voltage swing at the base of a switching transistor to switch the transistor from its cutoff state well into its saturated state. ECL circuits generally allow active-region transistor operation with a small input-voltage swing. Consequently, such circuits are generally faster than other types of logic circuits since the operation of a transistor deep in its saturated region requires more time to switch that transistor as compared with a transistor operating in its active region. Assuming the use of modern bipolar technology, a forward biased base-emitter voltage drop of approximately 0.8 to 0.9 volts is required to operate a bipolar transistor in its active region. This likewise assumes a reversed biased collector-base junction. Consequently, approximately 0.8 to 0.9 volts is required across the collector-emitter junction of an operating transistor. Therefore, representative of voltage requirements of the circuit, approximately 0.85 volts (the average of 0.8 volts and 0.9 volts) is required across the following junctions: the base-emitter voltage of transistor Q15; the base-emitter junction of transistor Q8; the collector-emitter junction of transistor Q13; and the collector-emitter junction of transistor Q14. Additionally, a small voltage drop is necessarily needed across emitter resistor $R_E$. Thus, at least 3.4 volts are needed for the noted transistor junctions and perhaps 0.1 volts for voltage drop across the emitter resistor. Adopting these assumptions, the minimum supply voltage across the circuit shown in FIG. 1a is around 3.5 volts. Therefore, the minimum circuit supply voltage, Vcc, is 3.5 volts, assuming $V_{EE}$ is ground. For the ever increasing importance of operating circuits within limited power supply voltage constraints, 3.5 volts is an unacceptable minimum circuit supply voltage. Consequently, a need therefore exists for an ECL circuit which will operate below 3.5 volts.

BRIEF DESCRIPTION OF THE DRAWINGS

FIG. 3b is a schematic drawing which details the clamp illustrated in FIG. 3a.

FIG. 3c is a schematic drawing which details an alternative embodiment of the clamp illustrated in FIG. 3a.

FIG. 5 illustrates a schematic drawing of the invention which allows an improved ECL circuit which permits saturation control without the use of the clamp illustrated in FIG. 3a.

DETAILED DESCRIPTION OF THE INVENTION

Figure 2:
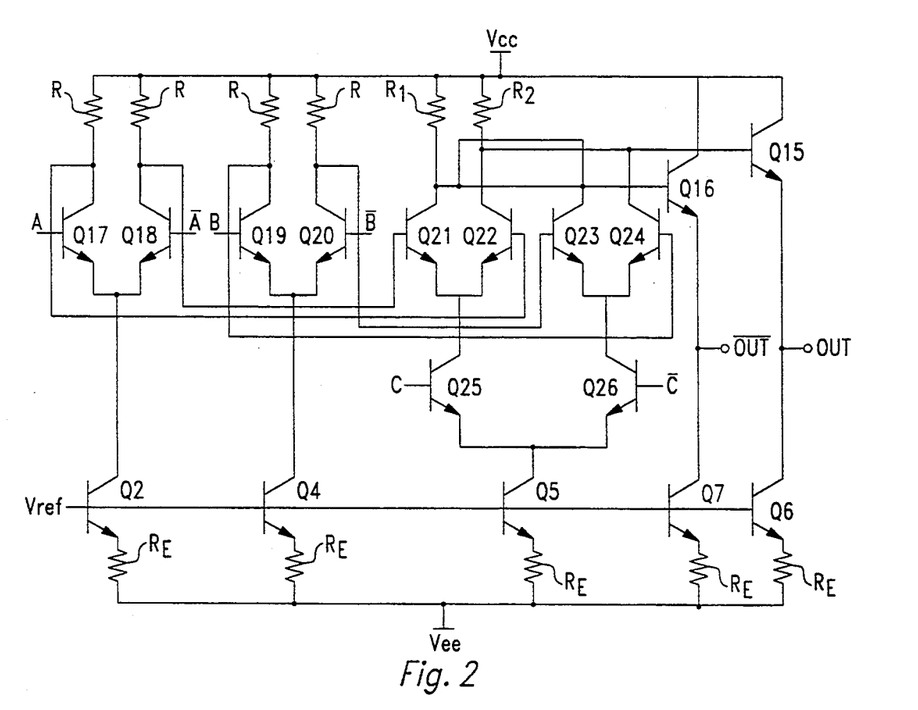
FIG. 2 is a schematic drawing of a circuit implementing an embodiment of the invention.

The invention allows the reduction of the minimum circuit supply voltage needed for an ECL circuit. In one embodiment of the invention, this reduction is provided by allowing a slight forward biasing, by a controlled amount, of one of the base-collector junctions of a bipolar transistor in the ECL circuit. FIG. 2 implements this aspect of the invention in the form of an ECL multiplexer (MUX) circuit which selects either input signal A or input signal B to be placed at output OUT (and its complement to placed at complement output $\overline{OUT}$), in connection with clock signal C. Bipolar transistor Q17 and bipolar transistor Q18 form an emitter coupled pair of transistors with transistor Q17 receiving input A at its base and with transistor Q18 receiving input $\overline{A}$ at its base. Bipolar transistor Q19 and bipolar transistor 20 form an emitter coupled pair of transistors with transistor Q19 receiving input B at its base while transistor Q20 receives input $\overline{B}$ at its base. Transistors Q17, Q18, Q19 and Q20 each have a collector resistor, R. Although shown here to be the same, the value of collector resistor R can vary for each transistor. Bipolar transistor Q21 and bipolar transistor Q22 form an emitter coupled pair of transistors with the base of transistor Q21 connected to the collector of transistor Q18 and the base of transistor Q22 connected to the collector of transistor Q17. Transistor Q21 is further connected to collector resistor $R_1$ and transistor Q22 is further connected to collector resistor $R_2$. Collector resistors $R_1$ and $R_2$ are additionally connected to supply voltage Vcc. Bipolar transistor Q23 and bipolar transistor Q24 form an emitter coupled pair whose emitters are further connected to the collector of bipolar transistor Q26. The base of transistor Q26 receives the inverted clock signal $\overline{C}$. Transistor Q26 and bipolar transistor Q25 form an emitter coupled pair. The base of transistor Q25 receives clock signal C. The collector of transistor Q25 is connected to the emitters of transistors Q21 and Q22.

In connection with transistor Q17 receiving a logic high A signal (and therefore, in connection with transistor Q18 receiving a logic low $\overline{A}$ signal), a voltage is placed on the base of transistor Q21 which is higher than the voltage placed on the base of transistor Q22. Consequently, since each transistor, shown in FIG. 1a, of an emitter-coupled pair has substantially the same area as the other transistor from the same emitter-coupled pair, transistor Q21 conducts more current than transistor Q22 in connection with transistor Q25 receiving a logic high clock signal C at its base. In fact, transistor Q21 is operating in a slightly saturated state and therefore, its base-collector junction is slightly forward biased. The collector of transistor Q21 is at a lower voltage level than the collector of transistor Q22 since transistor Q21 is conducting more current than transistor Q22. Transistor Q15, with its base connected to the collector of transistor Q22, pulls output OUT up in voltage to a logic high level. Transistor Q16, with its base connected to the collector of transistor Q21, may pull output $\overline{OUT}$ up in voltage but not enough to pull output $\overline{OUT}$ past a logic low value. Note, that with clock signal C at a logic high level, and thus clock signal $\overline{C}$, at a logic low level, transistors Q23 and Q24 are not in a conducting state and therefore, the logic at inputs B and $\overline{B}$ is of no consequence.

In connection with a logic low A input signal and a logic high clock signal C, transistor Q22 conducts more current than transistor Q21. Transistor Q22 is in fact saturated slightly, and consequently, its base-collector region is slightly forward biased. The collector of transistor Q21 is higher in voltage relative the collector of transistor Q22. Therefore, transistor Q16 pulls output $\overline{OUT}$ up in voltage to a logic high level. Transistor Q15 may pull output OUT up in voltage but not past a logic low level. Thus, with clock signal $\overline{C}$ at a logic high level, the MUX circuit selects input A as the logic signal reflected at output $\overline{OUT}$.

In connection with a logic high input signal B and a logic high clock signal $\overline{C}$ (which signifies multiplex selection of signal B), transistor Q23 with its base connected to the collector of transistor Q20 conducts more current than transistor Q24. Further, transistor Q23 is slightly saturated since its base-collector junction is slightly forward biased. The collector of transistor Q23 is therefore lower in voltage relative the collector of transistor Q24. Transistor Q15 pulls output OUT up to a logic high level but transistor Q16 fails to pull output $\overline{OUT}$ past a logic low level. The relative states of inputs A and $\overline{A}$ are of no consequence since clock signal C is at a logic low level and transistors Q21, Q22, and Q25 are not active.

In connection with a logic low input signal B and a logic high clock signal $\overline{C}$, transistor Q24 is conducting more current than transistor Q23. Transistor Q24 is in a slightly saturated state since its base-collector junction is slightly forward biased. The collector of transistor Q24 is therefore lower in voltage relative the collector of transistor Q23. Transistor Q16 pulls output $\overline{OUT}$ up to a logic high level but transistor Q15 fails to pull output OUT past a logic low level. Logic low input signal B is selected in this manner. The relative states of inputs A and $\overline{A}$ are of no consequence since clock signal C is at a logic low level and transistors Q21, Q22, and Q25 are not active.

In the above examples illustrating circuit operation, the amount of forward bias of the base-collector junction of the saturated transistor can be controlled by the current through the transistor. For instance, current $I_{RE}$ through the emitter of transistor Q5 is approximated as follows:

$$I_{RE} = (Vref - Vbe)/R_E$$

where

Vbe is the base emitter voltage of transistor Q5.

The saturated transistor has a collector current $I_{C1}$ which is approximated as follows:

$$I_{C1} = (Vcc - Vcb)/R_x$$

where

Vcb is the base-collector voltage of the saturated transistor and where $R_x$ is the collector resistor of the saturated transistor, i.e. either $R_1$ or $R_2$.

Approximating collector currents with emitter currents from a path through a collector resistor $R_x$ and through transistor Q5, the base-collector voltage Vcb is approximated as follows:

$$Vcb = I_{RE} * R_x = (Vref - Vbe)R_x/R_E$$

The value of Vcb indicates a measure of saturation for a transistor. Generally, assuming normal mode, enhancement mode, transistor operation, the greater the absolute value of Vcb, assuming a forward biased base-collector junction, then the farther into the saturation region that the transistor operates. Therefore, it is easily seen that the amount of forward bias of the base-collector junction of the saturated transistor can be controlled by setting the ratio $R_x$ to $R_E$.

Figure 3A:
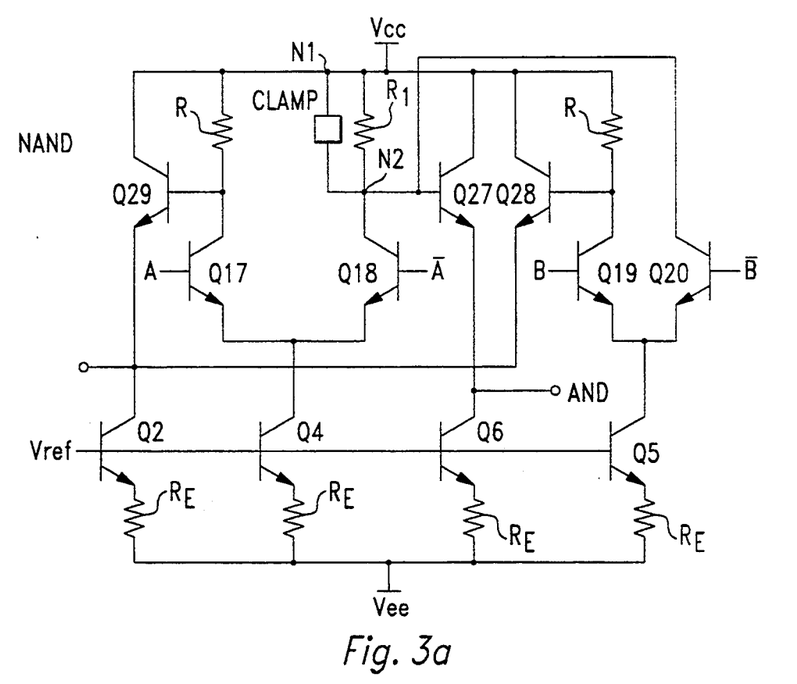
FIG. 3a is a schematic drawing of an alternative embodiment of the invention.

In order to allay any fears that the transistor operating in its saturated state goes too far into saturation so as to unnecessarily contribute to circuit operation time, an alternative embodiment of the invention is illustrated in the schematic drawing of FIG. 3a. FIG. 3a accomplishes this task through the use of a clamp. FIG. 3a illustrates an AND/NAND circuit which operates in response to inputs A, $\overline{A}$, B, and $\overline{B}$ according to the following truth table shown in table 2 below (logic low is represented by 0 and logic high is represented by 1:

TABLE 2

| INPUT A | INPUT $\overline{A}$ | INPUT B | INPUT $\overline{B}$ | AND | NAND |
|---|---|---|---|---|---|
| 1 | 0 | 0 | 1 | 0 | 1 |
| 0 | 1 | 1 | 0 | 0 | 1 |
| 1 | 0 | 1 | 0 | 1 | 0 |
| 0 | 1 | 0 | 1 | 0 | 1 |

If input A is logic 0 (input $\overline{A}$ is logic 1), then bipolar transistor Q27 fails to receive enough voltage at its gate to pull output AND up past a logic low level due to the pull down of voltage at the collector of activated transistor Q18. Transistor Q18, the collector of which is connected to the base of transistor Q27, is activated by the logic high level received at its base from input $\overline{A}$. Similarly, if input B is logic low, then the collector voltage of transistor Q20 (which is connected to the base of transistor Q27) and thus the base voltage of transistor Q27 is pulled down preventing transistor Q27 from pulling output AND past a logic low level. A logic high NAND level is produced either by bipolar transistor Q29 or by bipolar transistor Q28 pulling output NAND up in voltage in response to a logic low at the base of transistor Q17 or transistor Q19. A logic low NAND level is produced the collectors of transistors Q17 and Q19 pulling down the voltage levels at the base of transistor Q29 and the base of transistor Q28, respectively. The logic switching transistors are not allowed to operate in their saturation regions. More specifically, transistor Q27 is not allowed to operate in its saturation region when inputs A and B are both logic high since the voltage at the base of transistor Q27 is clamped by the clamp.

Figure 3B:
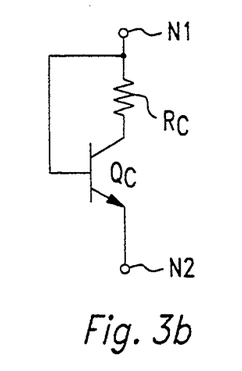

FIG. 3b is a schematic drawing which details the clamp connected at nodes N1 and N2 of FIG. 3a. As shown, the clamp comprises a bipolar transistor $Q_c$ with base resistor $R_c$, connected in a diode configuration. In operation, when transistor Q27 of FIG. 3a begins to turn on strongly due to logic high A and B inputs, its base voltage is clamped at a predetermined level. This predetermined level is determined by the voltage drop across resistor $R_c$ and the base emitter voltage of transistor $Q_c$ brought about by transistor $Q_c$ turning on. Thus transistor Q27 is prevented from operating in its saturation region.

Figure 3C:
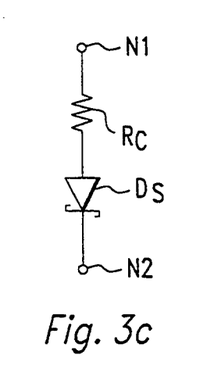

FIG. 3c is a schematic drawing which details an alternative embodiment of the clamp of FIG. 3a. Schottky diode $D_s$ is substituted for transistor $Q_c$ of FIG. 3b, and placed in series with resistor $R_c$ across nodes N1 and N2. Schottky diode $D_s$ cuts-in or rather fires at a predetermined voltage so as to clamp the voltage at the base of transistor Q27 of FIG. 3a.

Figure 4:
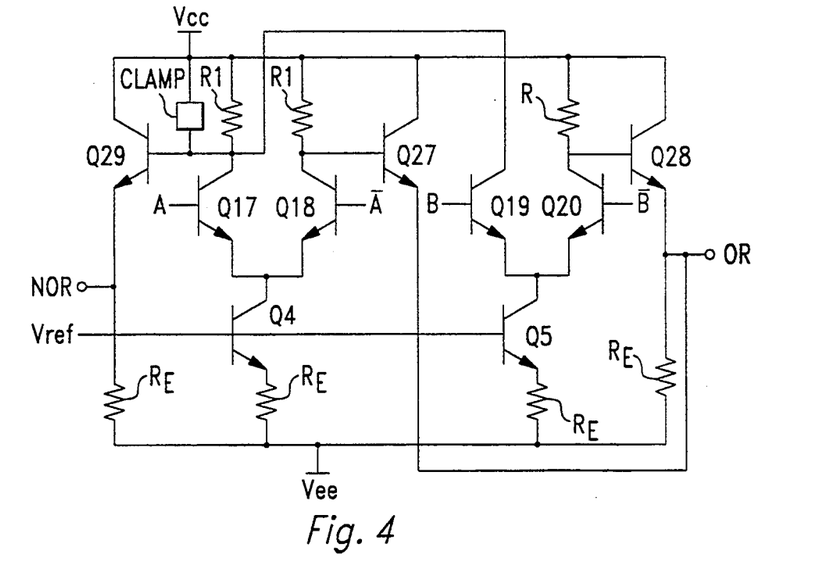
FIG. 4 illustrates a schematic drawing of an alternative embodiment of the invention.

FIG. 4 illustrates a schematic drawing of an alternative embodiment of the invention showing a different application from that of FIG. 3a. FIG. 4 illustrates an OR/NOR circuit which functions according to the following truth table shown in table 3 below (logic high represented by 1 and logic low represented by 0):

TABLE 3

| INPUT A | INPUT B | INPUT $\overline{A}$ | INPUT $\overline{B}$ | OR | NOR |
|---|---|---|---|---|---|
| 0 | 0 | 1 | 1 | 0 | 1 |
| 1 | 0 | 0 | 1 | 1 | 0 |
| 0 | 1 | 1 | 0 | 1 | 0 |
| 1 | 1 | 0 | 0 | 1 | 0 |

As demonstrated by Table 3, a logic high OR occurs when either transistor Q27 or transistor Q28 pulls the OR output up in voltage to a logic high level. This occurs response to a logic low $\overline{A}$ input or a logic low $\overline{B}$ input. A logic low OR input occurs when both inputs $\overline{B}$ and $\overline{A}$ are logic high. Therefore, transistors Q27 and Q28 are unable to sufficiently pull output OR up in voltage to a logic high level. A logic high NOR output occurs only when inputs A and B both have logic low values allowing transistor Q29 to pull output NOR up in voltage to a logic high level. Otherwise, a logic high input (logic high input A) will cause transistor Q17 to drop the voltage at the base of transistor Q29 or a logic high input (logic high input B) will cause transistor Q19 to drop the voltage at the base of transistor Q29. This decreased voltage at the base of transistor Q29 is sufficient to prevent transistor Q29 from pulling output NOR up in voltage to a logic high level. Clamp CP connected to and between the base and collector of transistor Q29 prevents transistor Q29 from operating within its saturation region. The clamp shown in FIG. 4 can comprise that illustrated in FIGS. 3b and 3c.

Note that for the circuits illustrated in FIGS. 3a and 4 that resistor R1 and $R_E$ can be adjusted to control the current through the transistor. Further, the clamp must become more robust as the gate width increases for the transistor for which control is desired. Clamp CP can be implemented by the use of perhaps 2 $TiSi_2$ diodes in series or 1 PtSi diode. Additionally, the two transistors whose collectors are connected to clamp CP can have both of their bases fabricated in a common collector tank for better performance. As with most ECL circuits as is herein throughout, it is preferable to have the top rail or rather the top supply voltage Vcc, to be at circuit ground while the lower rail $V_{EE}$ is below circuit ground. This allows optimal convenience when interfacing with other types of logic circuits, e.g. transistor transistor logic (TTL) circuits which generally operate outside of ECL logic voltage ranges.

Figure 5:
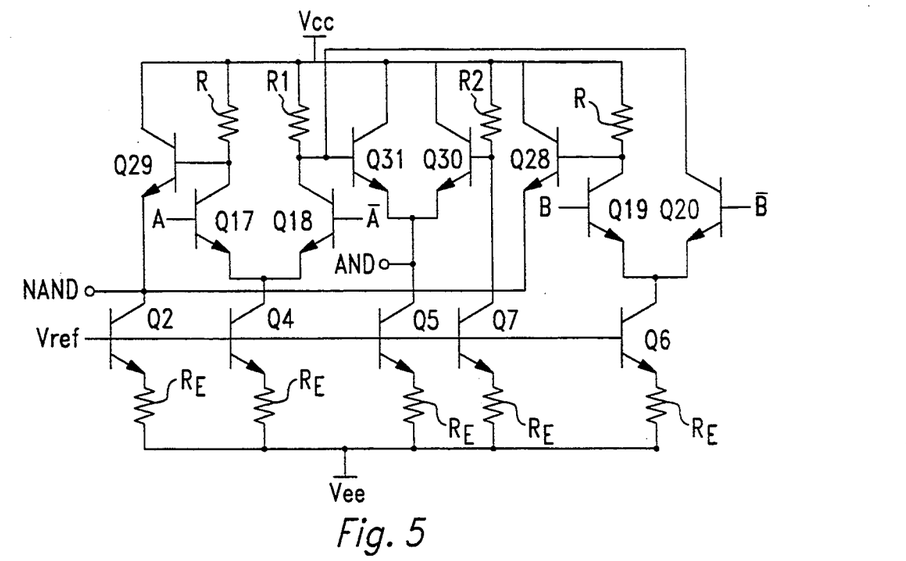

Generally, in order to match the specific clamping voltages required for a clamp, the clamp must be specially ordered so as to be fabricated to meet clamp specifications. Although clamps can be fabricated according to well know fabrication processes, such specially ordered fabrication can be expensive. In using an "off-the-shelf" clamp, the diode, or diode connected transistor is not always well matched to resistor $R_c$ (shown in FIG. 3b and 3c). Thus, some mismatch will occur during operation. This mismatch can be too large for high performance, differential ECL levels. FIG. 5 is a schematic drawing which illustrates an improved ECL circuit which allows saturation control without the use of the clamp element illustrated in FIG. 3a. The circuit of FIG. 5 performs an AND/NAND function according to table 2. As shown, emitter coupled bipolar transistors Q30 and Q31 are substituted for transistor Q27 of FIG. 3a. Further, resistor R2 is connected to the base of transistor Q30. Clamping is performed in this circuit by the combination of resistor R2 and transistor Q30 in order to prevent transistor Q18 from operating in its saturation region. In connection with inputs $\overline{A}$ and $\overline{B}$ both being logic high, the collector voltage at transistor Q18 will begin to drop. This voltage drop is limited by transistor Q30 which will turn on to prevent the collector voltage from falling past a predetermined level set by the base-emitter operating voltage of transistor Q30 and the voltage drop across resistor R2. Resistor R1 connected to the collector of transistor Q18 and the base of transistor Q31 also determines the predetermined level. In this embodiment of the invention, all switching transistors are prevented from operating in their saturated regions. Therefore, the base-collector voltage of transistor Q18 does not become forward biased as long as the logic swing at the emitter of transistor Q31 is less than one half a transistor forward biased base-emitter diode drop. Assuming this forward bias drop is 0.8 volts, one typical logic voltage swing is around 300 mV.

Figure 6:
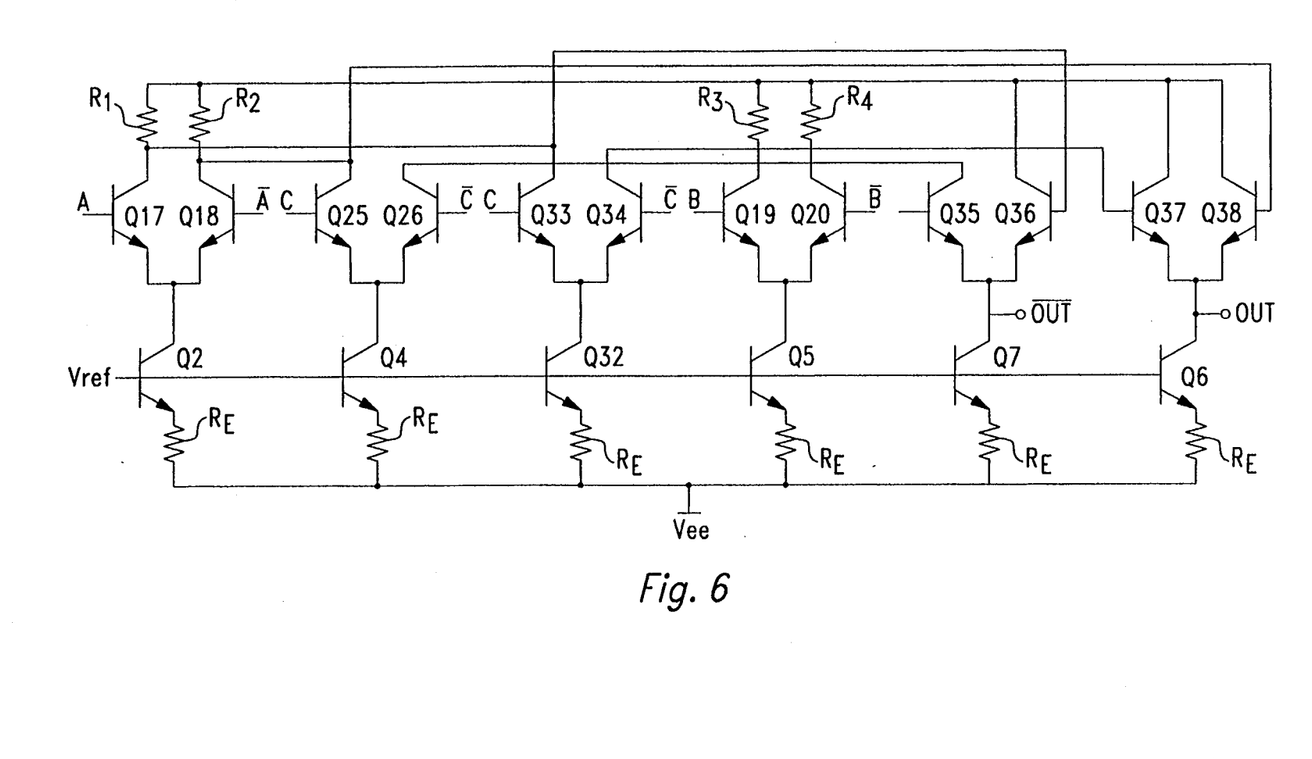
FIG. 6 illustrates a schematic drawing of an alternative embodiment of the invention.

FIG. 6 illustrates a schematic drawing of a circuit of an alternative embodiment of the invention. The circuit in FIG. 6 implements a MUX. When clock input C is at a logic high level the logic level of input B is placed at output OUT and the logic level of input $\overline{B}$ is placed at output $\overline{OUT}$. When clock input $\overline{C}$ is at a logic high level the logic level of input A is placed at output OUT and the logic level of input $\overline{A}$ is placed at output $\overline{OUT}$. Note that two bipolar transistors, transistor Q33 and transistor Q34, form emitter coupled pairs and that clock input C is received at the base of transistor Q33 while clock input $\overline{C}$ is received at the base of transistor Q34. Bipolar transistor Q32 is connected to the emitters of Q33 and Q34 and serves as a current source operating off of reference voltage Vref. Further, note that bipolar transistors Q35 and Q36 form emitter coupled pairs connected to output $\overline{OUT}$ and note that bipolar transistors Q37 and Q38 form emitter coupled pairs connected to output OUT.

When clock input C is logic high and input B is logic high the base of transistor Q35 is pulled down in voltage by the collector of transistors Q19 (which is turned on). The base of transistor Q36 is pulled down in voltage by at least the collector of transistor Q33 (which is also turned on). If, in addition to clock input C and input B being at logic high voltage levels, input A is logic high, the base of transistor Q36 is additionally pulled down in voltage by the collector of transistor Q17. With either case, output OUT is logic high due to the fact that transistors Q20 and Q34 are not conducting and thus the base of transistor Q37 which is connected to the collectors of these transistors receives a relatively high voltage through resistor R3 which is connected to power supply voltage Vcc. Output $\overline{OUT}$ is a logic low level due to the pull down in voltage at the collector of turned on transistor Q19 which pulls down the base of transistor Q35 and due to the pull down in voltage at the collector of turned on transistor Q33 which pulls down the base of transistor Q36. If on the other hand, input B is at a logic low level, (therefore $\overline{B}$ being at logic high and assuming still a logic high clock input C), the base of both transistors Q37 and Q38 will be pulled down in voltage by at least one collector of a transistor which is in operation. For instance, transistor Q37's base is pulled down by transistor Q20's collector and transistor Q38's base is pulled down by transistor Q25's collector and possibly transistor Q18's collector if input $\overline{A}$ is at a logic high value. The pull down of the voltage on the bases of transistors Q37 and Q38 result in a logic low level presented at output OUT. Output $\overline{OUT}$ is at a logic high level due to the pull up in voltage by transistor Q35.

When clock input C is logic low (clock input $\overline{C}$ is logic high) and input A is logic high, the base of transistor Q37 is pulled down in voltage by the collector of transistor Q34 (and possibly pulled down by transistor Q20 if input $\overline{B}$ is a logic high value) and the base of transistor Q38 receives enough voltage from supply Vcc such that a logic high output is placed at output OUT. Output $\overline{OUT}$ is at a logic low level due to the pull down in voltage at the base of transistor Q35 by the collector of conducting transistor Q26 (and possibly transistor Q19 if input B is logic high) and due to the pull down in voltage at the base of transistor Q36 by the collector of conducting transistor Q17.

When clock input C is logic low (clock input $\overline{C}$ is logic high) and input A is logic low (input $\overline{A}$ is logic high) the base of transistor Q38 is pulled down in voltage by the collector of conducting transistor Q18 and the base of transistor Q37 is pulled down in voltage by the collector of conducting transistor Q34 (and by possibly the collector of transistor Q20 if input $\overline{B}$ is logic high). This results in output OUT having a logic low value. Output $\overline{OUT}$ is pulled to a logic high voltage level by transistor Q36.

Figure 7:
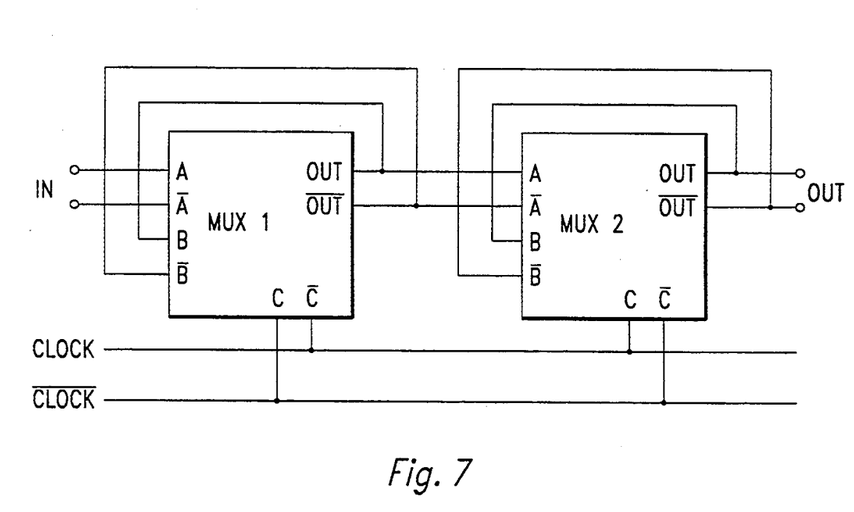
FIG. 7 is a schematic drawing of an alternative embodiment of the invention which implements a D-type flip flop.

Two MUX circuits of the type shown in FIG. 6 can be connected together as shown in the schematic drawing of FIG. 7 to implement a D-type flip flop. With reference to FIG. 7, MUX 1 provides the input of the D-type flip flop through MUX 1 input's A and $\overline{A}$. In connection with system clock CLOCK, which serves as MUX 1's clock input $\overline{C}$, having a logic high value, input A and $\overline{A}$ are placed at MUX 1's outputs OUT and $\overline{OUT}$, respectively. Output OUT and $\overline{OUT}$ are input to MUX 1's inputs B and $\overline{B}$, respectively. The current state at MUX 2's outputs OUT and $\overline{OUT}$ changes to reflect the values at MUX 2's inputs B and $\overline{B}$, respectively, in connection with the logic high system clock CLOCK (which is connected to MUX 2's clock input C). In connection with a logic high system clock $\overline{CLOCK}$ (and therefore a logic low system clock CLOCK), MUX 2's outputs OUT and $\overline{OUT}$ change to reflect the current values at MUX 2's inputs A and $\overline{A}$, respectively, which are equal to the values at MUX 1's outputs OUT and $\overline{OUT}$, respectively. MUX 1's outputs OUT and $\overline{OUT}$ reflect the values at MUX 1's inputs B and $\overline{B}$ in connection with the logic high system clock $\overline{CLOCK}$.

The circuit of FIG. 6 can be used to make other types of gates such as NOR/OR gates, or NAND/AND gates.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by persons of ordinary skill in the art having reference to this description. For instance, field effect transistors (both n-type and p-type) can be substituted for bipolar transistors, and pnp transistors can be substituted for npn transistors. It is contemplated that all such changes and additional embodiments are within the spirit and true scope of the invention as claimed below.

We claim:

1. A differential emitter coupled logic circuit having an output and a compliment of the output, said circuit comprising:
   a supply voltage;
   a first resistor having two terminals, wherein one terminal connected to said supply voltage;
   a second resistor having two terminals, wherein one terminal connected to said supply voltage;
   a third resistor having two terminals, wherein one terminal connected to said supply voltage;
   a fourth resistor having two terminals, wherein one terminal connected to said supply voltage;
   a first emitter coupled transistor pair, the base of one transistor connected to a first input signal and the collector connected to the other terminal of said first resistor, the base of the other transistor of said pair is connected to the compliment of said first input signal and the collector of said other transistor connected to the other terminal of said second resistor;
   a second emitter coupled transistor pair, the base of one transistor connected to a second input signal and the collector connected to the other terminal of said third resistor, the base of the other transistor of said pair is connected to the compliment of said second input signal and the collector of said other transistor connected to the other terminal of said fourth resistor;
   a third emitter coupled transistor pair in which the base of one of the transistors connected to a third input signal and the base of the other transistor connected to the compliment of said third input signal, the collector of said one of the transistors is connected to said collector of said other transistor of said first transistor pair and the collector of said other transistor of said third transistor pair is connected to said collector of said one transistor of said second transistor pair;
   a fourth emitter coupled transistor pair in which the base of one of the transistors is connect to said third input signal and the base of the other transistor is connected to said compliment of said third input signal, the collector of said one transistor connected to said collector of said one transistor of said first transistor pair;
   a fifth emitter coupled transistor pair connected to said third and fourth transistor pairs, said coupled emitters connected to said output; and
   a sixth emitter coupled transistor pair connected to said third and fourth transistor pairs, said coupled emitters connected to said compliment of said output.

2. The differential emitter coupled logic circuit of claim 1, wherein said circuit can perform an AND, NAND, OR, or NOR function by changing connections to said collectors of said transistor pairs.

3. The differential emitter coupled logic circuit of claim 1, wherein said circuit can perform a latch, or MUX function depending on the inputs to said third and fourth transistor pairs.

* * * * *